(12) United States Patent
Wilharm

(10) Patent No.: US 10,103,673 B2
(45) Date of Patent: Oct. 16, 2018

(54) MOTOR APPARATUS COMPRISING AT LEAST TWELVE COILS

(71) Applicant: Robert Bosch GmbH, Stuttgart (DE)

(72) Inventor: Torsten Wilharm, Buehl (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/541,605

(22) PCT Filed: Dec. 15, 2015

(86) PCT No.: PCT/EP2015/079817
§ 371 (c)(1),
(2) Date: Jul. 5, 2017

(87) PCT Pub. No.: WO2016/110381
PCT Pub. Date: Jul. 14, 2016

(65) Prior Publication Data
US 2017/0346435 A1    Nov. 30, 2017

(30) Foreign Application Priority Data
Jan. 9, 2015  (DE) .................. 10 2015 200 226

(51) Int. Cl.
*H02P 1/32*    (2006.01)
*H02P 25/22*   (2006.01)
(Continued)

(52) U.S. Cl.
CPC ............ *H02P 25/22* (2013.01); *H02K 3/28* (2013.01); *H02K 29/03* (2013.01); *H02P 27/085* (2013.01); *H05K 7/2089* (2013.01); *B60L 3/003* (2013.01)

(58) Field of Classification Search
CPC .................... H02P 25/22; H02P 6/085
See application file for complete search history.

(56) References Cited

U.S. PATENT DOCUMENTS

2011/0204833 A1*  8/2011  Santo .................. H02P 21/05
                                                 318/400.23
2011/0316462 A1   12/2011  Bouchez et al.

FOREIGN PATENT DOCUMENTS

DE   102006056855    6/2008
DE   102013208569   11/2014
(Continued)

OTHER PUBLICATIONS

International Search Report for Application No. PCT/EP2015/079817 dated Apr. 26, 2016 (English Translation, 3 pages).
(Continued)

*Primary Examiner* — Karen Masih
(74) *Attorney, Agent, or Firm* — Michael Best & Friedrich LLP

(57) ABSTRACT

The invention is based on a motor apparatus, in particular on an EC motor apparatus, comprising at least one stator (12a; 12b; 12c) which has at least twelve coils (14a, 14a', 16a, 16a', 18a, 18a', 20a, 20d, 22a, 22b', 24a, 24a'; 14b, 14b', 16b, 6b', 18b, 18b', 20b, 20b', 22b, 22b', 24b, 24b'; 14c, 16c, 18c, 20c, 22c, 24c, 142c, 44c, 146c, 148c, 150c, 152c), and comprising at least one power supply unit (26a; 26b; 26c). It is proposed that coils (14a, 14a', 16a, 16a', 18a, 18a', 20a, 20a', 22a, 22a', 24a, 24a'; 14b, 4b', 16b, 16b', 18b, 18b', 20b, 20b', 22b, 22b', 24b, 24b'; 14c, 16c, 18c, 20c, 22c, 24c, 42c, 144c, 146c, 148c, 150c, 152c), which directly follow one another in the circumferential direction (36a; 36b; 36c), of the at least one stator (12a; 12b; 12c) are connected to differing phases of the power supply unit (26a; 26b; 26c) in at least one operating state.

11 Claims, 8 Drawing Sheets

(51) Int. Cl.
    *H02P 27/08*      (2006.01)
    *H05K 7/20*      (2006.01)
    *H02K 3/28*      (2006.01)
    *H02K 29/03*      (2006.01)
    *B60L 3/00*      (2006.01)

(56) References Cited

FOREIGN PATENT DOCUMENTS

| | | |
|---|---|---|
| EP | 2056445 | 5/2009 |
| WO | 2010110483 | 9/2010 |

OTHER PUBLICATIONS

Kraßer, B., "Optimierte Auslegung eriner Modularen Dauermagnetmaschine für ein Autarkes Hybridfahrzeug" Lehrstuhl für Elektrische Maschinen und Geräte, TU München, Aug. 2, 2000, Seiten 1-113 (English Abstract included).

\* cited by examiner

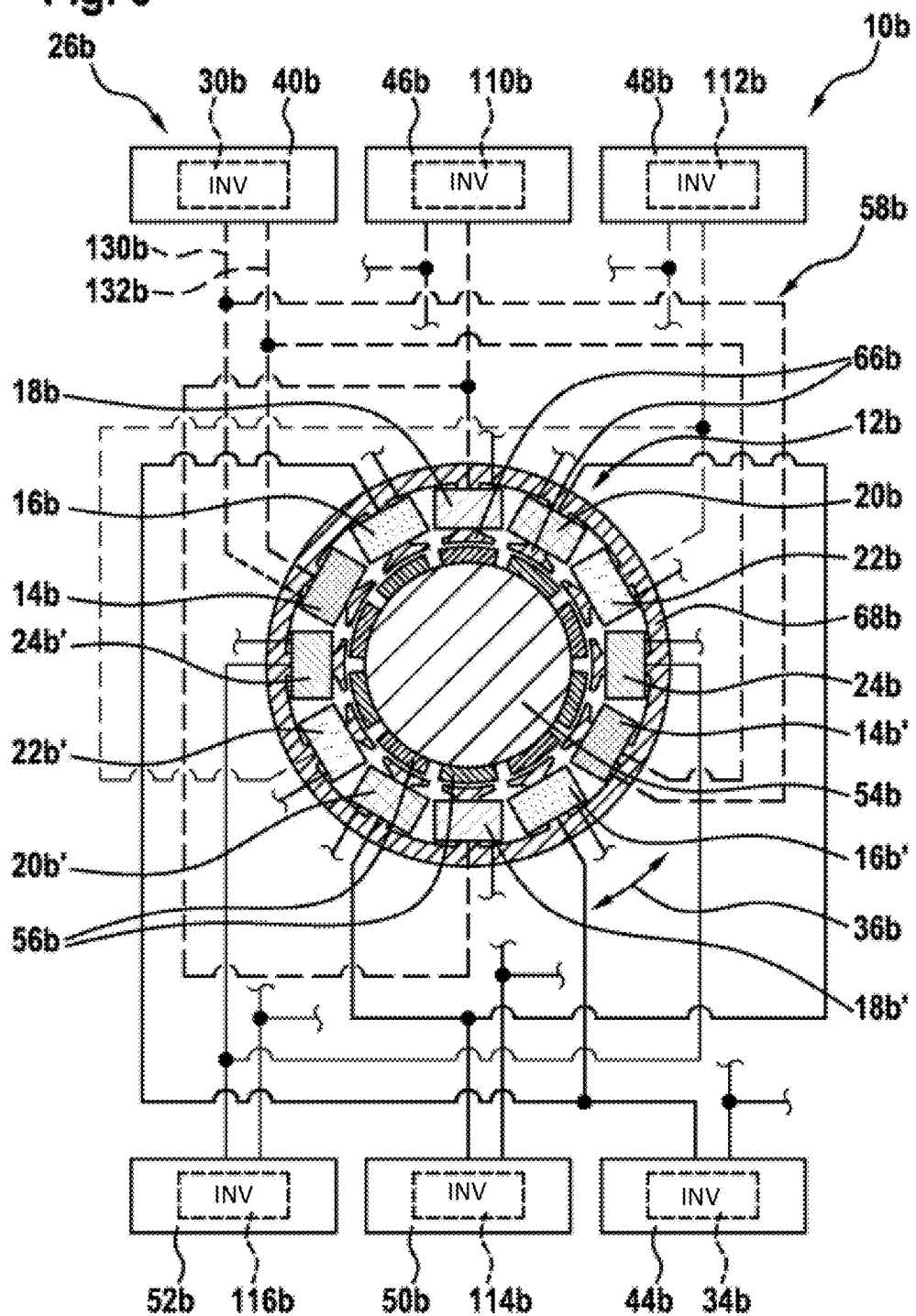

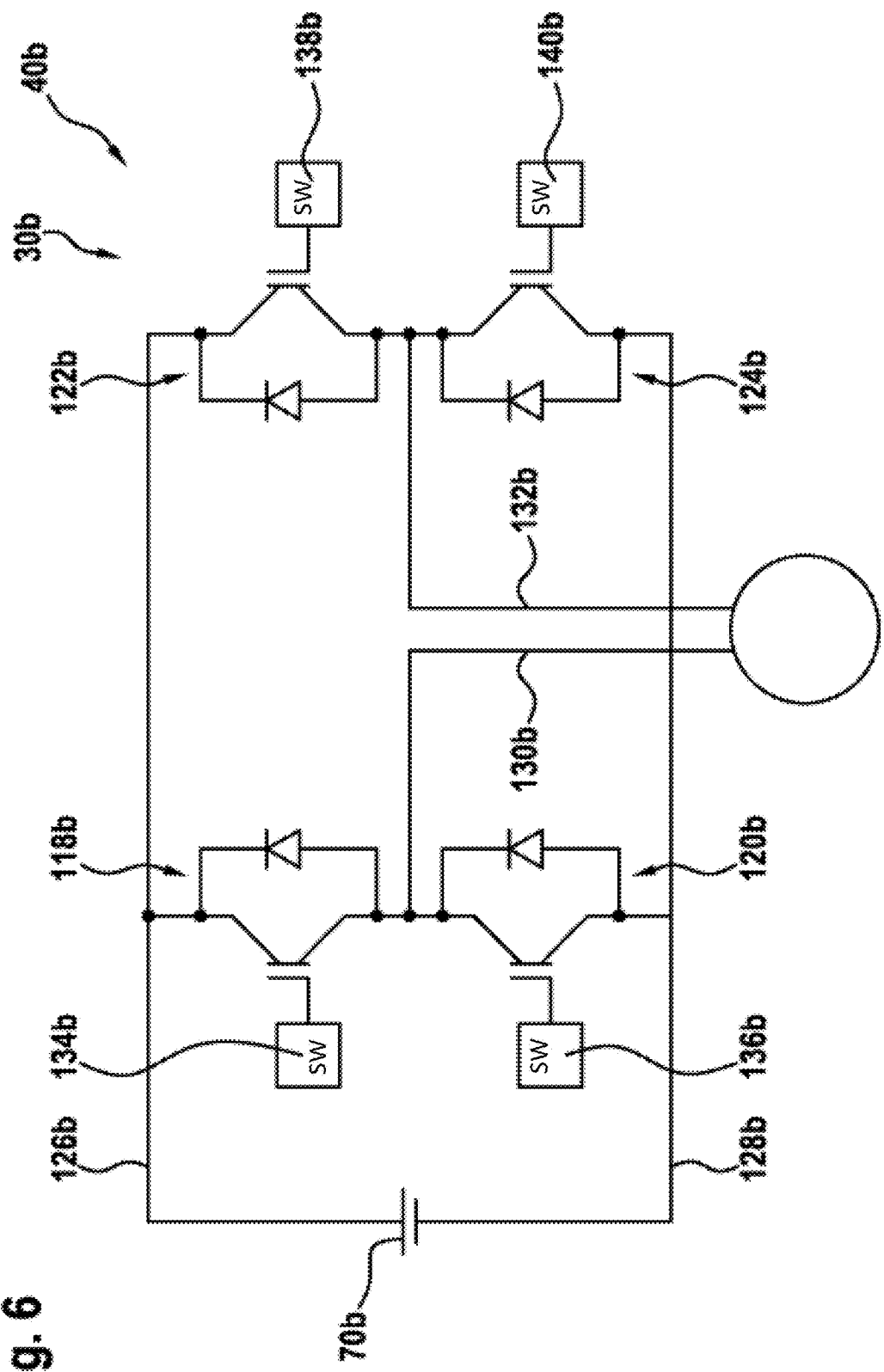

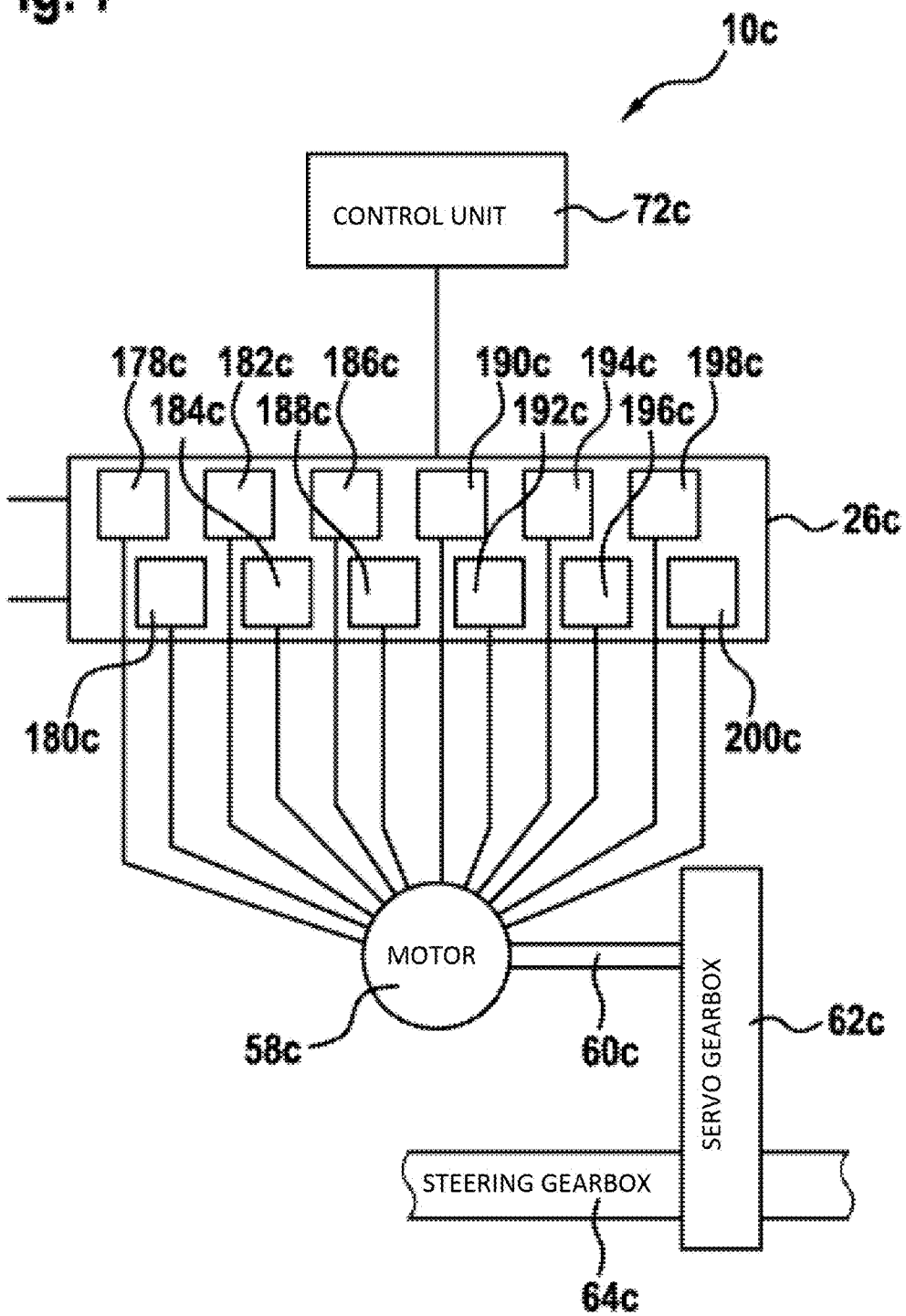

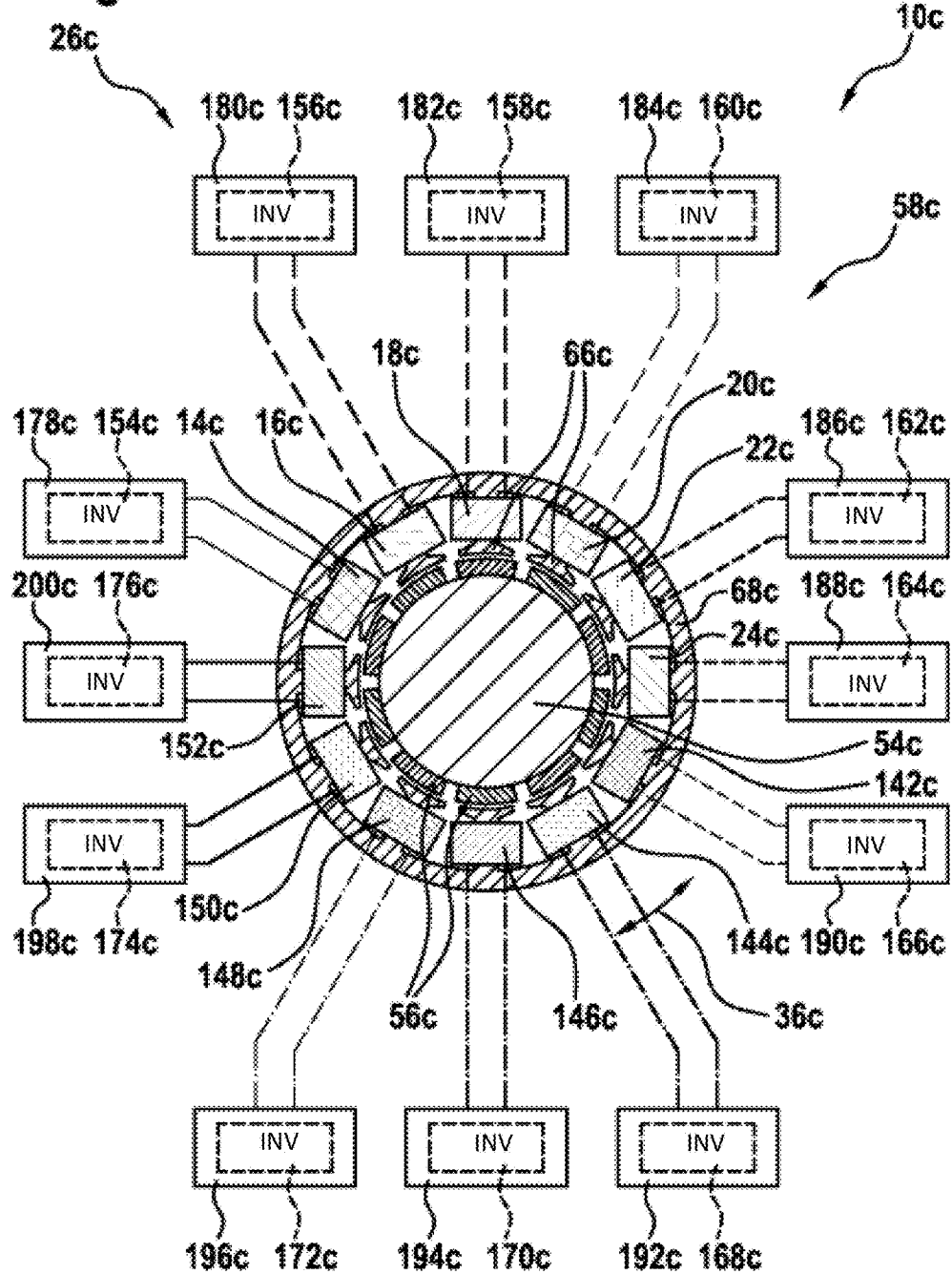

MOTOR APPARATUS COMPRISING AT LEAST TWELVE COILS

BACKGROUND OF THE INVENTION

A motor apparatus, in particular an EC motor apparatus, comprising at least one stator which has at least twelve coils, and comprising at least one power supply unit, has already been proposed. In this case, each of the coils directly following one another in the circumferential direction is energized in parallel in order to simplify the connectivity and reduce the complexity of the connections. The amount of heat developed by a circuit can also be kept low as a result.

SUMMARY OF THE INVENTION

The invention is directed to a motor apparatus, in particular an EC motor apparatus, comprising at least one stator which has at least twelve coils, and comprising at least one power supply unit.

It is proposed that coils, which directly follow one another in the circumferential direction, of the at least one stator are connected to different phases of the power supply unit in at least one operating state. Coils, which directly follow one another in the circumferential direction, of the at least one stator are preferably energized by different inverters of the power supply unit. Particularly preferably, the stator comprises precisely twelve coils. In this context, a "stator" is considered to be, in particular, a fixed, unmovable part of the motor apparatus. Preferably, the stator is intended to at least partially surround a rotor, in one operating state. The stator preferably comprises multiple inwardly extending stator teeth, on each of which a coil is disposed.

Furthermore, in this context, a "coil" is considered to be, in particular, an element having at least one winding which is provided for generating and/or detecting a magnetic field. Preferably, this is also considered to be an element having at least one winding of a current conductor, preferably a wire. Particularly preferably, the coils each comprise at least one core which is formed by one stator tooth in each case. A "power supply unit" in this context is considered to be, in particular, a unit which is provided, in one operating state, for energizing the stator. The power supply unit is preferably controlled by means of a control unit. "Provided" is considered to mean, in particular, specially programmed, designed and/or equipped. Stating that an object is provided for a certain function is considered to mean, in particular, that the object meets and/or carries out this certain function in at least one application and/or operating state.

As a result of the design of the motor apparatus according to the invention, a high winding factor can be advantageously achieved. Preferably, an optimal energization can be achieved. Furthermore, an advantageously high flux linkage can be achieved. An advantageously high heat dissipation can be achieved, in particular due to a uniform loss distribution.

Furthermore, it is proposed that the at least one power supply unit comprises at least one first inverter which is provided at least for energizing one first coil and one second coil of the stator, and comprises at least one second inverter which is provided at least for energizing one further coil of the stator, which is disposed between the first coil and the second coil in the circumferential direction. The expression "the further coil is disposed between the first coil and the second coil in the circumferential direction" in this context is considered to mean, in particular, that at least one further coil is disposed between the first coil and the second coil in a circumferential direction of the stator along the coils of the stator. Preferably, the first coil and the second coil are separated in the circumferential direction by at least one further coil. Particularly preferably, the first coil and the second coil are separated in both circumferential directions by at least one further coil in each case. As a result, an advantageously high winding factor can be achieved. Furthermore, an advantageously high flux linkage can be achieved. In addition, an advantageously high heat dissipation can be achieved, in particular due to a uniform loss distribution.

It is further proposed that the at least one power supply unit comprises at least one first inverter assembly which includes the first inverter, and comprises at least one second inverter assembly which includes the second inverter. In this context, an "inverter assembly" is considered to be, in particular, an assembly having at least one inverter. Preferably, this is considered to be, in particular, a circuit designed as an assembly, in particular a bridge circuit which comprises at least one semiconductor switch, in particular a transistor. Particularly preferably, this is considered to be, in particular, a circuit designed as an assembly which is provided for converting a DC voltage into an AC voltage, in particular having a variable frequency and/or a variable pulse width. As a result, inverter assemblies can be utilized, in particular, for energizing the coils. Preferably, standardized inverter assemblies can therefore be utilized, in particular. As a result, design complexity can be advantageously minimized. Furthermore, manufacturing costs can be kept low as a result.

It is further proposed that the second inverter assembly of the at least one power supply unit is designed to be out-of-phase with respect to the first inverter assembly of the at least one power supply unit. Preferably, the second inverter assembly is out-of-phase with respect to the first inverter assembly in this case by an angle which results from 360° divided by the number of coils of the stator. As a result, a reliable and precise control of the coils can be achieved, in particular. In particular, an advantageously high winding factor can be achieved.

It is further proposed that at least one of the at least two inverter assemblies is designed as a three-fold half bridge. Preferably, both inverter assemblies are designed as three-fold half bridges. A "three-fold half bridge" in this context is considered to be, in particular, a circuit having three half-bridge stages. As a result, a number of components and/or assemblies can be kept low, in particular. Furthermore, it is therefore advantageously possible to shorten the active parts. In addition, an advantageously high winding factor can be achieved. Furthermore, an advantageously high flux linkage can be achieved. An advantageously high heat dissipation can be achieved, in particular due to a uniform loss distribution. In addition, an advantageously high torque can be achieved in the emergency operating mode, i.e., using only one inverter assembly. An improvement of torque ripple and noise can be achieved. Furthermore, a low demagnetization load can be achieved. As a result, a reduction of the magnet mass and/or an advantageously high permissible phase current can be made possible.

It is further proposed that at least one of the at least two inverter assemblies is designed as a four-quadrant regulator. Preferably, at least both inverter assemblies are designed as four-quadrant regulators. Preferably, all inverter assemblies of the at least one power supply unit are designed as four-quadrant regulators. Particularly preferably, the at least one power supply unit comprises six inverter assemblies, each of which is designed as a four-quadrant regulator. A "four-quadrant regulator" in this context is considered to be, in particular, a circuit having four semiconductor switches. Preferably, this is considered to be, in particular, a circuit which comprises an electronic H-bridge circuit formed from four semiconductor circuits, in particular transistors. As a result, an advantageously high winding factor can be achieved. Furthermore, it is therefore advantageously possible to shorten the active parts. Furthermore, an advantageously high flux linkage can be achieved. An advantageously high heat dissipation can be achieved, in particular due to a uniform loss distribution. In addition, an advantageously high torque can be achieved in the emergency operating mode, i.e., using only one inverter assembly. An improvement of torque ripple and noise can be achieved. Furthermore, a low demagnetization load can be achieved. As a result, a reduction of the magnet mass and/or an advantageously high permissible phase current can be made possible.

By using multiple inverter assemblies which are designed as four-quadrant regulators and which are provided, in particular, for energizing one coil group in each case, it is advantageously possible to achieve a tolerance compensation in terms of geometry and material properties. For example, one single magnet which is too weak, or an air gap constriction can be compensated for by way of additional currents which are individually impressed into the coils. As a result, in turn, an improvement in noise and smooth running can be achieved.

Furthermore, it is proposed that opposing coils of the at least one stator form one coil group in each case. In this context, "opposing coils" is considered to be, in particular, coils which are disposed opposite one another relative to a central axis of the stator. A "coil group" in this context is considered to be, in particular, a group of coils which are controlled by the same phase of the power supply unit in at least one operating state. Preferably, this is considered to be, in particular, a group of coils which are energized by the same inverter. As a result, a particularly advantageous interconnection can be achieved, in particular. In addition, an advantageously high winding factor can be achieved. Preferably, an optimal interconnection can be achieved as a result, in particular given an even number of poles on a rotor.

Furthermore, it is proposed that opposing coils of the at least one stator are connected in parallel in each case. Preferably, the coils of one coil group are connected in parallel. In principle, it would also be conceivable, however, for opposing coils of the at least one stator to be connected in series in each case. As a result, a particularly advantageous interconnection can be achieved, in particular.

In addition, it is proposed that each of the coils of the at least one stator are energized by one inverter of the power supply unit. Preferably, each coil is energized by a different inverter. Preferably, each of the coils of the at least one stator is energized by one inverter of one of the inverter assemblies. Particularly preferably, the inverter assemblies are designed as four-quadrant regulators in this case. In principle, it would also be conceivable, however, for three inverters to form one part of a three-fold half bridge. As a result, an individual energization can be achieved. Preferably, a tolerance compensation in terms of geometry and material properties can be advantageously achieved. For example, one single magnet which is too weak, or an air gap constriction can be compensated for by way of additional currents which are individually impressed into the coils. As a result, in turn, an improvement in noise and smooth running can be achieved.

It is further proposed that the motor apparatus comprises at least one rotor which has at least ten poles. Preferably, the rotor comprises at least ten magnet poles. Preferably, the rotor comprises precisely ten or precisely 14 poles.

In this context, a "rotor" is considered to be, in particular, a rotatable part of the motor apparatus, which is preferably designed so as to be rotatable about a defined rotational axis. Preferably, the rotor is intended to be at least partially surrounded by a stator, in one operating state. As a result, a particularly advantageous interconnection can be achieved, in particular. Particularly preferably, a particularly advantageous winding factor can be achieved by means of a 12/10 topology or a 12/14 topology. Furthermore, by means of a 12/10 topology or a 12/14 topology, a particularly advantageous pitch factor and a particularly advantageous zoning factor can be achieved.

In addition, an EPS drive comprising a motor apparatus is proposed. An "EPS drive" in this context is considered to be, in particular, an electric drive of an electrically driven steering system. Preferably, this is considered to be, in particular, an electric drive of an electric power steering system which is provided for generating an auxiliary force in the case of a steering movement. The application of the motor apparatus in an EPS drive is merely an example, in particular. In principle, another use of the motor apparatus that appears reasonable to a person skilled in the art would also be conceivable, however.

The motor apparatus according to the invention is not intended to be limited to the above-described application and embodiment. In particular, the motor apparatus according to the invention can have a number of individual elements, components, and units which deviates from a number mentioned herein, in order to operate in a manner described herein.

BRIEF DESCRIPTION OF THE DRAWINGS

Further advantages result from the following description of the drawing. The drawing shows a representation of three exemplary embodiments of the invention. The drawing, the description, and the claims contain numerous features in combination. A person skilled in the art will advantageously also consider the features individually and group them into further reasonable combinations.

In the drawing:

FIG. 5 shows a schematic depiction of the alternative motor apparatus according to the invention, comprising a stator which has twelve coils, comprising a rotor which has ten poles, and comprising a power supply unit which has six inverter assemblies;

FIG. 6 shows a schematic depiction of a circuit diagram of one of the inverter assemblies of the power supply unit of the alternative motor apparatus according to the invention;

FIG. 7 shows a schematic depiction of an EPS drive comprising a further alternative motor apparatus according to the invention and comprising a steering gearbox; and FIG. 8 shows a schematic depiction of the further alternative motor apparatus according to the invention, comprising a stator which has twelve coils, comprising a rotor which has ten poles, and comprising a power supply unit which has six inverter assemblies.

DETAILED DESCRIPTION

Figure 1:
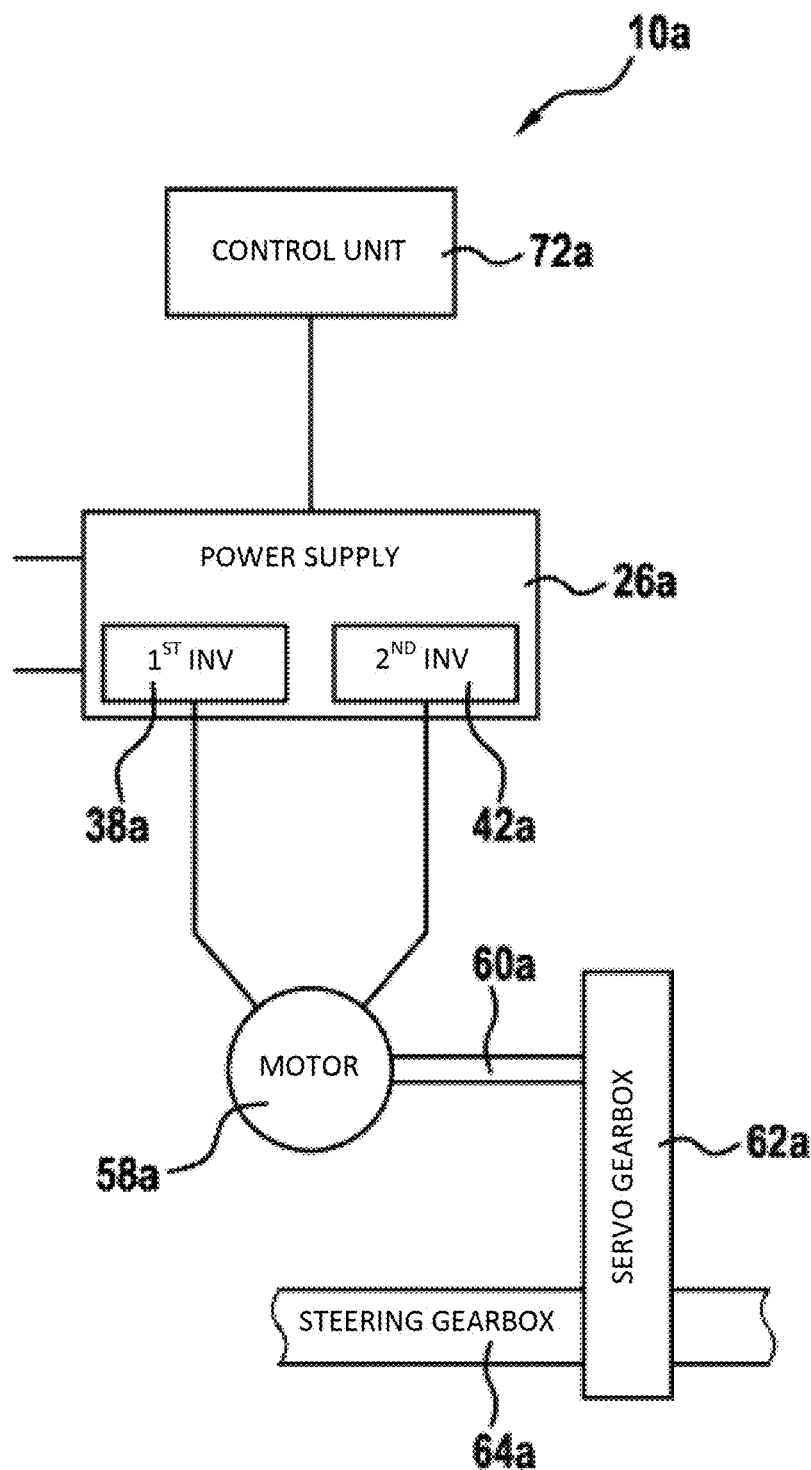
FIG. 1 shows a schematic depiction of an EPS drive comprising a motor apparatus according to the invention and comprising a steering gearbox.

FIG. 1 shows an EPS drive comprising a motor apparatus 10a according to the invention. The motor apparatus 10a comprises a motor 58a. The motor 58a is designed as an EC motor. The motor 58a is designed as brushless DC motor. The motor 58a is energized by a power supply unit 26a. For this purpose, the power supply unit 26a is connected to a DC voltage source 70a. Furthermore, the power supply unit 26a is controlled by a control unit 72a. The motor 58a drives a shaft 60a of the EPS drive. The shaft 60a is connected to a servo gearbox 62a of the EPS drive. The servo gearbox 62a is directly connected to a steering gearbox 64a. The EPS drive is provided for generating an auxiliary force in the case of a steering movement. The auxiliary force is introduced at a steering gearbox 64a. In principle, another design of an EPS drive that appears reasonable to a person skilled in the art would also be conceivable, however. The design which is shown is provided by way of example, in particular. In principle, another use of the motor apparatus 10a that appears reasonable to a person skilled in the art would also be conceivable.

Figure 2:
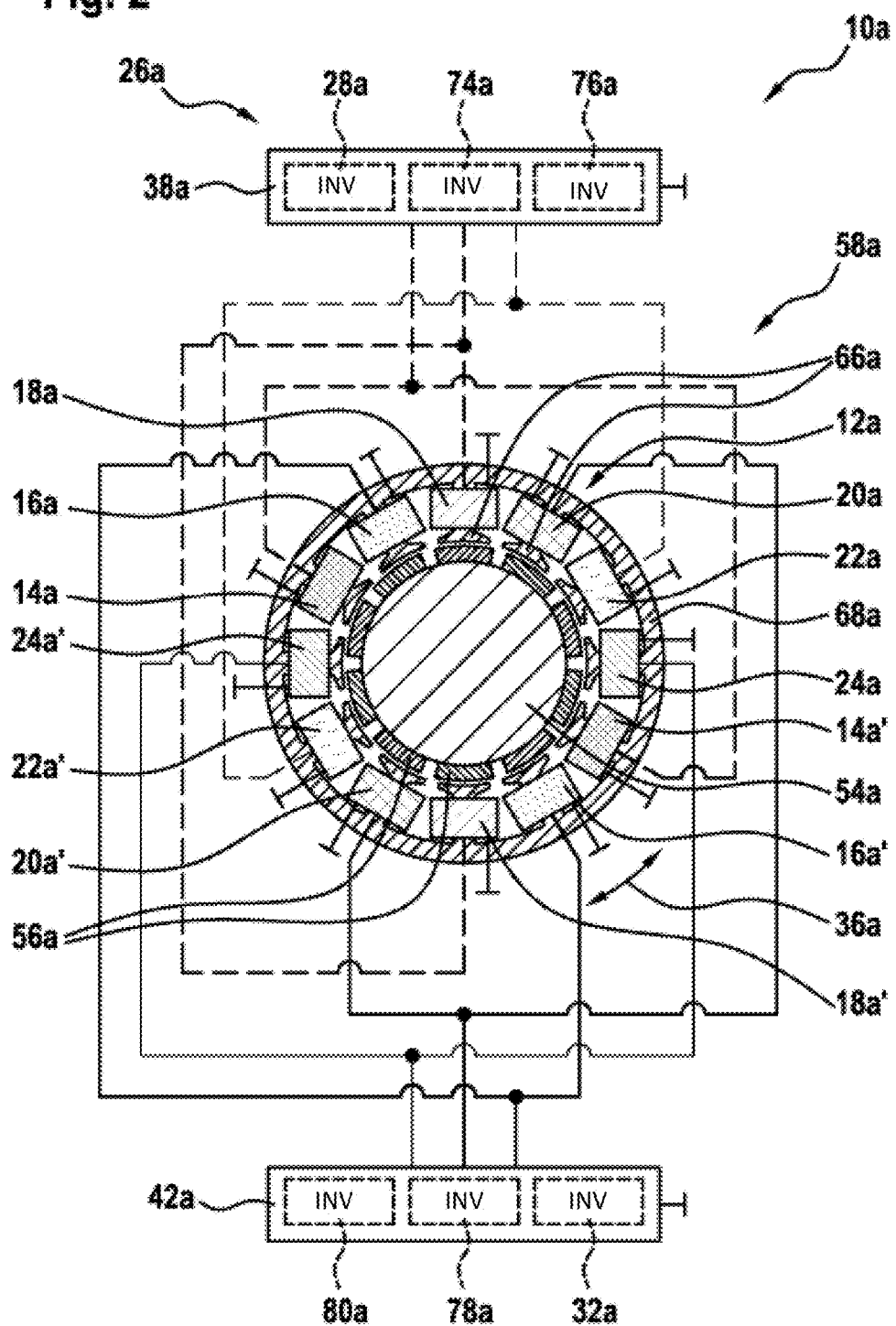
FIG. 2 shows a schematic depiction of the motor apparatus according to the invention, comprising a stator which has twelve coils, comprising a rotor which has ten poles, and comprising a power supply unit which has two inverter assemblies.

The motor apparatus 10a is designed as an EC motor apparatus. The motor apparatus 10a comprises a stator 12a. The motor apparatus 10a further comprises a rotor 54a. The motor 58a comprises the stator 12a and the rotor 54a. The stator 12a comprises at least six coils 14a, 14a', 16a, 16a', 18a, 18a', 20a, 20a', 22a, 22a', 24a, 24a'. The stator 12a comprises twelve coils 14a, 14a', 16a, 16a', 18a, 18a', 20a, 20a', 22a, 22a', 24a, 24a'. Furthermore, the stator 12a comprises twelve stator teeth 66a. The stator teeth 66a are designed at least approximately identically. The stator teeth 66a are disposed on an outer ring 68a of the stator 12a. The stator teeth 66a extend from the outer ring 68a inwardly in the direction of a rotational axis of the motor 58a. The stator teeth 66a are each designed integrally with the outer ring 68a. The stator teeth 66a each form one core of the coils 14a, 14a', 16a, 16a', 18a, 18a', 20a, 20a', 22a, 22a', 24a, 24a'. Each of the coils 14a, 14a', 16a, 16a', 18a, 18a', 20a, 20a', 22a, 22a', 24a, 24a' is would around one stator tooth 66a. An insulation layer, which is not further visible, is wound around each of the coils 14a, 14a', 16a, 16a', 18a, 18a', 20a, 20a', 22a, 22a', 24a, 24a', which adjoin one another in the circumferential direction 36a. In principle, it would also be conceivable, however, to dispense with an insulation layer (FIG. 2).

The rotor 54a of the motor apparatus 10a comprises at least ten poles 56a. The rotor 54a comprises ten poles 56a. The poles 56a are each designed as rotor magnets. In principle, another design of the poles 56a that appears reasonable to a person skilled in the art would also be conceivable. For example, it would be conceivable that the poles 56a on one annular magnet or on multiple magnet shells are magnetized. The motor 58a therefore has a 12/10 topology. In principle, another number of poles 56a that appears reasonable to a person skilled in the art would also be conceivable. Preferably, a number of fourteen poles 56a would also be conceivable, in particular. The motor 58a would therefore have a 12/14 topology. The poles 56a are designed as permanent magnets. The poles 56a are distributed around a circumference of the rotor 54a. Poles 56a disposed next to one another in the circumferential direction 36a have an opposing polarity in each case (FIG. 2).

The motor apparatus 10a comprises a power supply unit 26a. The power supply unit 26a is provided, in one operating state, for energizing the motor 58a. The power supply unit 26a is provided, in one operating state, for energizing the coils 14a, 14a', 16a, 16a', 18a, 18a', 20a, 20a', 22a, 22a', 24a, 24a'. The power supply unit 26a comprises a first inverter 28a which is provided for energizing a first coil 14a and a second coil 14a' of the stator 12a. The power supply unit 26a further comprises a second inverter 32a which is provided for energizing two further coils 16a, 16a' of the stator 12a, which are disposed between the first coil 14a and the second coil 14a' in the circumferential direction 36a. The power supply unit 26a comprises six inverters 28a, 32a, 74a, 76a, 78a, 80a. The inverters 28a, 32a, 74a, 76a, 78a, 80a are provided for energizing two coils 14a, 14a', 16a, 16a', 18a, 18a', 20a, 20a', 22a, 22a', 24a, 24a' in each case. The two coils 14a, 14a', 16a, 16a', 18a, 18a', 20a, 20a', 22a, 22a', 24a, 24a', which are supplied with current by the same inverter 28a, 32a, 74a, 76a, 78a, 80a, form one coil group. In order to label the coil groups, coils 14a, 14a', 16a, 16a', 18a, 18a', 20a, 20a', 22a, 22a', 24a, 24a' of one coil group have the same reference number, wherein one of the coils 14a, 14a', 16a, 16a', 18a, 18a', 20a, 20a', 22a, 22a', 24a, 24a' of a coil group is provided with an apostrophe in order to be differentiated in each case. Opposing coils 14a, 14a', 16a, 16a', 18a, 18a', 20a, 20a', 22a, 22a', 24a, 24a' of the stator 12a form one coil group in each case. Opposing coils 14a, 14a', 16a, 16a', 18a, 18a', 20a, 20a', 22a, 22a', 24a, 24a' are supplied with current by the same inverter 28a, 32a, 74a, 76a, 78a, 80a, respectively. Coils 14a, 14a', 16a, 16a', 18a, 18a', 20a, 20a', 22a, 22a', 24a, 24a' of the stator 12a, which directly follow one another in the circumferential direction 36a, are connected to different phases of the power supply unit 26a in one operating state.

The coils 14a, 14a', 16a, 16a', 18a, 18a', 20a, 20a', 22a, 22a', 24a, 24a' of one coil group are connected to one of the inverters 28a, 32a, 74a, 76a, 78a, 80a, respectively. The coils 14a, 14a', 16a, 16a', 18a, 18a', 20a, 20a', 22a, 22a', 24a, 24a' of one coil group are connected via lines to the particular assigned inverter 28a, 32a, 74a, 76a, 78a, 80a. The coils 14a, 14a', 16a, 16a', 18a, 18a', 20a, 20a', 22a, 22a', 24a, 24a' of one coil group are connected in parallel in this case. Therefore, opposing coils 14a, 14a', 16a, 16a', 18a, 18a', 20a, 20a', 22a, 22a', 24a, 24a' of the stator 12a are connected in parallel in each case. In principle, it would also be conceivable, however, to connect the coils 14a, 14a', 16a, 16a', 18a, 18a', 20a, 20a', 22a, 22a', 24a, 24a' of one coil group in series. A return line of the coils 14a, 14a', 16a, 16a', 18a, 18a', 20a, 20a', 22a, 22a', 24a, 24a' is formed by a system ground connection.

The power supply unit 26a comprises a first inverter assembly 38a which includes the first inverter 28a. The first inverter assembly 38a further includes two further inverters 74a, 76a. Furthermore, the power supply unit 26a comprises a second inverter assembly 42a which includes the second inverter 32a. The second inverter assembly 42a further includes two further inverters 78a, 80a. The first inverter assembly 38a and the second inverter assembly 42a are each designed as three-fold half bridges. The first inverter assembly 38a and the second inverter assembly 42a are each provided for providing three phases. The second inverter assembly 42a of the power supply unit 26a is designed out-of-phase with respect to the first inverter assembly 38a of the power supply unit 26a. The second inverter assembly 42a of the power supply unit 26a is designed out-of-phase with respect to the first inverter assembly 38a of the power supply unit 26a, corresponding to the displacement of the ten poles 56a with respect to one another, which are offset by 30°, for example, in this case.

The first inverter assembly 38a, in one operating state, supplies current to every second coil group, as viewed in the circumferential direction 36a of the stator 12a. Intermediate coil groups are supplied with current, in one operating state, by the second inverter assembly 42a. Therefore, every second coil 14a, 14a', 18a, 18a', 22a, 22a', as viewed in the circumferential direction 36a of the stator 12a, is supplied with current by the first inverter assembly 38a. Furthermore, every second coil 16a, 16a', 20a, 20a', 24a, 24a', as viewed in the circumferential direction 36a of the stator 12a, is supplied with current by the second inverter assembly 42a.

Figure 3:
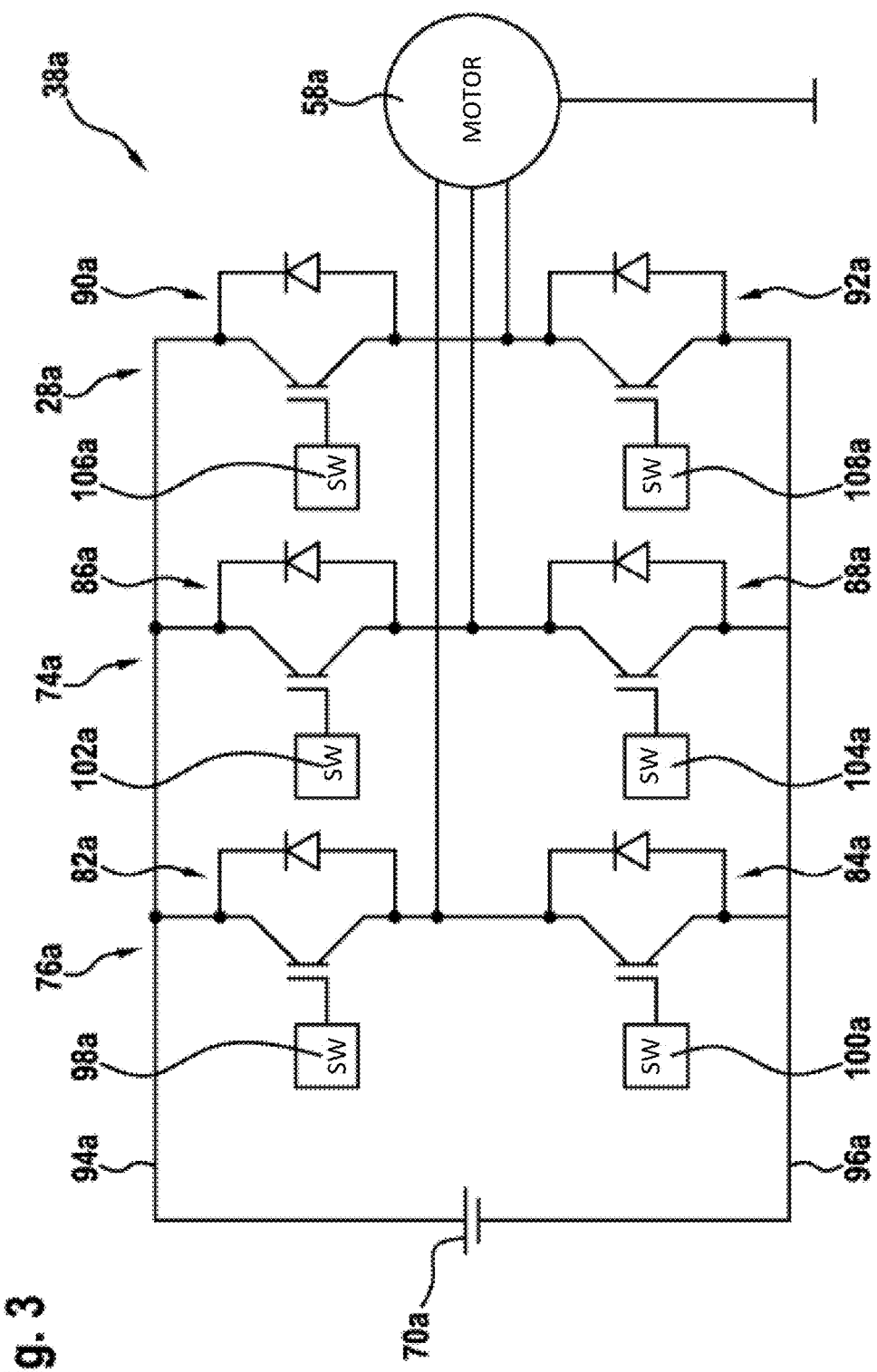
FIG. 3 shows a schematic depiction of a circuit diagram of one of the inverter assemblies of the power supply unit of the motor apparatus according to the invention.

FIG. 3 shows a schematic depiction of a circuit diagram of the first inverter assembly 38a. The second inverter assembly 42a is designed identically to the first inverter assembly 38a. A description of a circuit diagram of the first inverter assembly 38a can therefore also be applied to the second inverter assembly 42a. The differences between the first inverter assembly 38a and the second inverter assembly 42a are therefore essentially that the inverter assemblies 38a, 42a are connected to different coils 14a, 14a', 16a, 16a', 18a, 18a', 20a, 20a', 22a, 22a', 24a, 24a' in each case and are controlled in a phase-shifted manner by the control unit 72a.

The first inverter assembly 38a comprises three inverters 28a, 74a, 76a. The inverters 28a, 74a, 76a are each designed as half-bridge stages. The inverters 28a, 74a, 76a comprise a shared power supply. The inverters 28a, 74a, 76a of the first inverter assembly 38a are connected to the DC voltage source 70a. The DC voltage source 70a provides a voltage having a sign that remains the same. A level of the voltage of the DC voltage source 70a can vary over time. Preferably, the DC voltage source 70a provides a constant voltage. The inverters 28a, 74a, 76a of the first inverter assembly 38a each have two semiconductor switches 82a, 84a, 86a, 88a, 90a, 92a. The semiconductor switches 82a, 84a, 86a, 88a, 90a, 92a are each designed as transistors having one diode. The semiconductor switches 82a, 84a, 86a, 88a, 90a, 92a of an inverter 28a, 74a, 76a are each disposed on a path between a supply-line path 94a and a return-line path 96a. A phase for the motor 58a is tapped between the semiconductor switches 82a, 84a, 86a, 88a, 90a, 92a of an inverter 28a, 74a, 76a in each case. The semiconductor switches 82a, 84a, 86a, 88a, 90a, 92a are each controlled by one switch element 98a, 100a, 102a, 104a, 106a, 108a of the control unit 72a. The phases of the inverters 28a, 74a, 76a of the first inverter assembly 38a are each controlled via the control unit 72a (FIG. 3).

By means of an appropriate interconnection of the coils 14a, 14a', 16a, 16a', 18a, 18a', 20a, 20a', 22a, 22a', 24a, 24a' of the motor apparatus 10a having a 12/10 topology, a winding factor of 0.966 can be preferably achieved. Furthermore, a pitch factor of 0.966 and a zoning factor of 1.000 can be achieved. A gain of flux linkage of 1.035 results. In the case of motor apparatuses having a classical interconnection of the coils in a 12/10 topology, all that can be achieved is a winding factor of 0.933 and a zoning factor of 0.966.

Two further exemplary embodiments of the invention are shown in FIGS. 4 to 8. The following descriptions are essentially limited to the differences between the exemplary embodiments, wherein reference can be made to the description of the other exemplary embodiments, in particular in FIGS. 1 to 3, with respect to components, features, and functions which remain the same. In order to differentiate the exemplary embodiments, the letter "a" in the reference numbers of the exemplary embodiment in FIGS. 1 to 3 is replaced by the letters "b" and "c" in the reference numbers of the exemplary embodiments in FIGS. 3 to 8. With reference to components which are described in the same way, in particular components having the same reference numbers, reference can be made to the drawings and/or the description of the other exemplary embodiments, in particular with respect to FIGS. 1 to 3.

Figure 4:
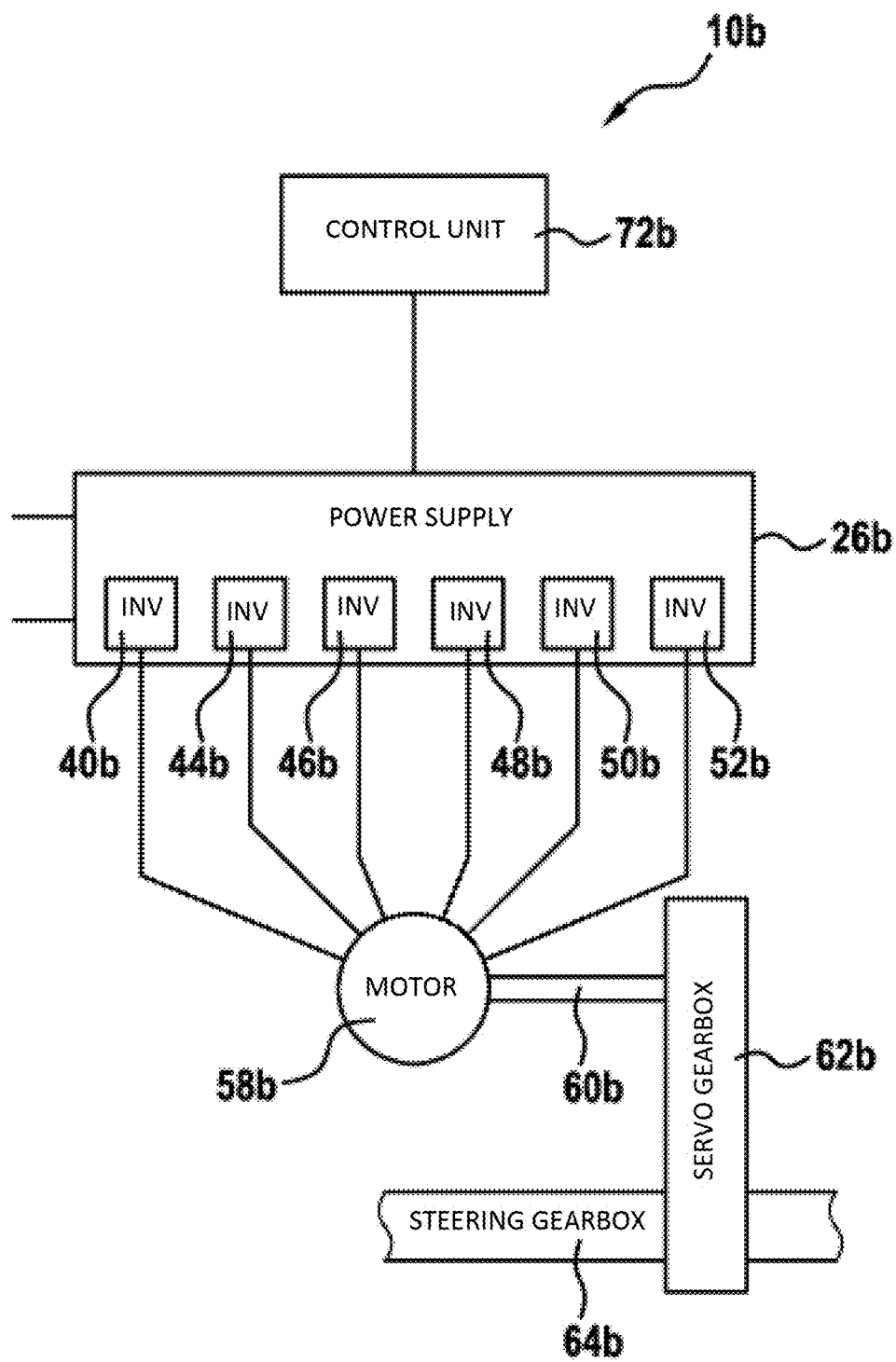
FIG. 4 shows a schematic depiction of an EPS drive comprising an alternative motor apparatus according to the invention and comprising a steering gearbox.

FIG. 4 shows an EPS drive comprising an alternative motor apparatus 10b according to the invention.

The motor apparatus 10b comprises a power supply unit 26b. The power supply unit 26b is provided, in one operating state, for energizing the motor 58b. The power supply unit 26b is provided, in one operating state, for energizing the coils 14b, 14b', 16b, 16b', 18b, 18b', 20b, 20b', 22b, 22b', 24b, 24b'. The power supply unit 26b comprises a first inverter 30b which is provided for energizing a first coil 14b and a second coil 14b' of the stator 12b. The power supply unit 26b further comprises a second inverter 34b which is provided for energizing two further coils 16b, 16b' of the stator 12b, which are disposed between the first coil 14b and the second coil 14b' in the circumferential direction 36b. The power supply unit 26b comprises six inverters 30b, 34b, 110b, 112b, 114b, 116b. The inverters 30b, 34b, 110b, 112b, 114b, 116b are provided for energizing two coils 14b, 14b', 16b, 16b', 18b, 18b', 20b, 20b', 22b, 22b', 24b, 24b', respectively. The two coils 14b, 14b', 16b, 16b', 18b, 18b', 20b, 20b', 22b, 22b', 24b, 24b', which are supplied with current by the same inverter 30b, 34b, 110b, 112b, 114b, 116b, form one coil group. In order to label the coil groups, coils 14b, 14b', 16b, 16b', 18b, 18b', 20b, 20b', 22b, 22b', 24b, 24b' of one coil group have the same reference number, wherein one of the coils 14b, 14b', 16b, 16b', 18b, 18b', 20b, 20b', 22b, 22b', 24b, 24b' of a coil group is provided with an apostrophe in order to be differentiated in each case. Opposing coils 14b, 14b', 16b, 16b', 18b, 18b', 20b, 20b', 22b, 22b', 24b, 24b' of the stator 12b form one coil group in each case. Opposing coils 14b, 14b', 16b, 16b', 18b, 18b', 20b, 20b', 22b, 22b', 24b, 24b' are supplied with current by the same inverter 30b, 34b, 110b, 112b, 114b, 116b in each case. Coils 14b, 14b', 16b, 16b', 18b, 18b', 20b, 20b', 22b, 22b', 24b, 24b' of the stator 12b, which directly follow one another in the circumferential direction 36b, are connected to different phases of the power supply unit 26b in one operating state (FIG. 5).

The coils 14b, 14b', 16b, 16b', 18b, 18b', 20b, 20b', 22b, 22b', 24b, 24b' of one coil group are connected to one of the inverters 30b, 34b, 110b, 112b, 114b, 116b, respectively. The coils 14b, 14b', 16b, 16b', 18b, 18b', 20b, 20b', 22b, 22b', 24b, 24b' of one coil group are connected via lines to the particular assigned inverter 30b, 34b, 110b, 112b, 114b, 116b. The coils 14b, 14b', 16b, 16b', 18b, 18b', 20b, 20b', 22b, 22b', 24b, 24b' of one coil group are connected in parallel in this case. Therefore, opposing coils 14b, 14b', 16b, 16b', 18b, 18b', 20b, 20b', 22b, 22b', 24b, 24b' of the stator 12b are connected in parallel in each case. In principle, it would also be conceivable, however, to connect the coils 14b, 14b', 16b, 16b', 18b, 18b', 20b, 20b', 22b, 22b', 24b, 24b' of one coil group in series. Each coil group comprises a separate supply-line path 130b from the particular assigned inverter 30b, 34b, 110b, 112b, 114b, 116b. Furthermore, each coil group comprises a separate return-line path 132b to the particular assigned inverter 30b, 34b, 110b, 112b, 114b, 116b. For the sake of clarity, FIG. 5 shows only the return-line path 132b between the first inverter 30b and the first coil 14b and the second coil 14b' in entirety. The remaining return-line paths are shown only in part (FIG. 5).

The power supply unit 26b comprises a first inverter assembly 40b which includes the first inverter 30b. Furthermore, the power supply unit 26b comprises a second inverter assembly 44b which includes the second inverter 34b. In addition, the power supply unit 26b comprises four further inverter assemblies 46b, 48b, 50b, 52b which include an inverter 110b, 112b, 114b, 116b, respectively. At least one of the six inverter assemblies 40b, 44b, 46b, 48b, 50b, 52b is designed as a four-quadrant regulator. The six inverter assemblies 40b, 44b, 46b, 48b, 50b, 52b are designed as four-quadrant regulators. The inverter assemblies 40b, 44b, 46b, 48b, 50b, 52b are each provided for providing a phase. The second inverter assembly 44b of the power supply unit 26b is designed out-of-phase with respect to the first inverter assembly 40b of the power supply unit 26b. The inverter assemblies 40b, 44b, 46b, 48b, 50b, 52b are all designed so as to be out-of-phase with respect to one another. The inverter assemblies 40b, 44b, 46b, 48b, 50b, 52b are designed so as to be out-of-phase by 30° in each case. The inverter assemblies 40b, 44b, 46b, 48b, 50b, 52b, in one operating state, each supply one coil group with current.

FIG. 6 shows a schematic depiction of a circuit diagram of the first inverter assembly 40b. The further inverter assemblies 44b, 46b, 48b, 50b, 52b are each designed identically to the first inverter assembly 40b. A description of a circuit diagram of the first inverter assembly 40b can therefore also be applied to the further inverter assemblies 44b, 46b, 48b, 50b, 52b. The differences between the first inverter assembly 40b and the further inverter assemblies 44b, 46b, 48b, 50b, 52b are essentially that the inverter assemblies 40b, 44b, 46b, 48b, 50b, 52b are each connected to different coils 14b, 14b', 16b, 16b', 18b, 18b', 20b, 20b', 22b, 22b', 24b, 24b' and are controlled in a phase-offset manner by a control unit 72b.

The first inverter assembly 40b comprises an inverter 30b. The inverter 30b is designed as a full bridge. The inverter 30b of the first inverter assembly 40b is connected to a DC voltage source 70b. The DC voltage source 70b provides a voltage having a sign that remains the same. A level of the voltage of the DC voltage source 70b can vary over time. Preferably, the DC voltage source 70b provides a constant voltage. The inverter 30b of the first inverter assembly 40b comprises four semiconductor switches 118b, 120b, 122b, 124b. The semiconductor switches 118b, 120b, 122b, 124b are each designed as transistors having one diode. Two of the semiconductor switches 118b, 120b, 122b, 124b of the inverter 30b are disposed, in each case, on a first path between a supply-line path 126b and a return-line path 128b of the DC voltage source 70b, and two more of the semiconductor switches 118b, 120b, 122b, 124b of the inverter 30b are disposed, in each case, on a second path between a supply-line path 126b and a return-line path 128b of the DC voltage source 70b. The supply-line path 130b and the return-line path 132b for the coil group comprising the first coil 14b and the second coil 14b', which is assigned to the inverter 30b, are tapped between the semiconductor switches 118b, 120b, 122b, 124b of a path. The semiconductor switches 118b, 120b, 122b, 124b are each controlled by one switch element 134b, 136b, 138b, 140b of the control unit 72b. The phases of the inverters 30b, 34b, 110b, 112b, 114b, 116b of the inverter assemblies 40b, 44b, 46b, 48b, 50b, 52b are controlled via the control unit 72b (FIG. 3).

FIG. 7 shows an EPS drive comprising an alternative motor apparatus 10c according to the invention.

The motor apparatus 10c comprises a power supply unit 26c. The power supply unit 26c is provided, in one operating state, for energizing the motor 58c. The power supply unit 26c is provided, in one operating state, for energizing the coils 14c, 16c, 18c, 20c, 22c, 24c, 142c, 144c, 146c, 148c, 150c, 152c. Coils 14c, 16c, 18c, 20c, 22c, 24c, 142c, 144c, 146c, 148c, 150c, 152c of the stator 12c directly following one another in the circumferential direction 36c are connected in one operating state to different phases of the power supply unit 26c. The coils 14c, 16c, 18c, 20c, 22c, 24c, 142c, 144c, 146c, 148c, 150c, 152c of the at least one stator 12c are energized by an inverter 154c, 156c, 158c, 160c, 162c, 164c, 166c, 168c, 170c, 172c, 174c, 176c, respectively, of the power supply unit 26c. The power supply unit 26c comprises twelve inverters 154c, 156c, 158c, 160c, 162c, 164c, 166c, 168c, 170c, 172c, 174c, 176c. The inverters 154c, 156c, 158c, 160c, 162c, 164c, 166c, 168c, 170c, 172c, 174c, 176c are provided for energizing one of the coils 14c, 16c, 18c, 20c, 22c, 24c, 142c, 144c, 146c, 148c, 150c, 152c, respectively. The coils 14c, 16c, 18c, 20c, 22c, 24c, 142c, 144c, 146c, 148c, 150c, 152c are connected via lines to the particular assigned inverter 154c, 156c, 158c, 160c, 162c, 164c, 166c, 168c, 170c, 172c, 174c, 176c. Each coil 14c, 16c, 18c, 20c, 22c, 24c, 142c, 144c, 146c, 148c, 150c, 152c comprises one separate supply-line path from the particular assigned inverter 154c, 156c, 158c, 160c, 162c, 164c, 166c, 168c, 170c, 172c, 174c, 176c. Furthermore, each coil 14c, 16c, 18c, 20c, 22c, 24c, 142c, 144c, 146c, 148c, 150c, 152c comprises a separate return-line path to the particular assigned inverter 154c, 156c, 158c, 160c, 162c, 164c, 166c, 168c, 170c, 172c, 174c, 176c (FIG. 8).

The power supply unit 26c comprises a first inverter assembly 178c which includes the first inverter 154c. Furthermore, the power supply unit 26c comprises a second inverter assembly 180c which includes the second inverter 156c. In addition, the power supply unit 26c comprises ten further inverter assemblies 182c, 184c, 186c, 188c, 190c, 192c, 194c, 196c, 198c, 200c which comprise one inverter 158c, 160c, 162c, 164c, 166c, 168c, 170c, 172c, 174c, 176c, respectively. At least one of the ten inverter assemblies 178c, 180c, 182c, 184c, 186c, 188c, 190c, 192c, 194c, 196c, 198c, 200c is designed as a four-quadrant regulator. The ten inverter assemblies 178c, 180c, 182c, 184c, 186c, 188c, 190c, 192c, 194c, 196c, 198c, 200c are designed as a four-quadrant regulators. The inverter assemblies 178c, 180c, 182c, 184c, 186c, 188c, 190c, 192c, 194c, 196c, 198c, 200c are each provided for providing a phase. The ten inverter assemblies 178c, 180c, 182c, 184c, 186c, 188c, 190c, 192c, 194c, 196c, 198c, 200c are all designed so as to be out-of-phase with respect to one another. The inverter assemblies 178c, 180c, 182c, 184c, 186c, 188c, 190c, 192c, 194c, 196c, 198c, 200c are designed so as to be out-of-phase by 30° in each case. The ten inverter assemblies 178c, 180c, 182c, 184c, 186c, 188c, 190c, 192c, 194c, 196c, 198c, 200c supply one coil 14c, 16c, 18c, 20c, 22c, 24c, 142c, 144c, 146c, 148c, 150c, 152c, respectively, with current, in one operating state.

The invention claimed is:

1. A motor apparatus, comprising at least one stator (12a; 12b; 12c) which has at least twelve coils (14a, 14a', 16a, 16a', 18a, 18a', 20a, 20a', 22a, 22a', 24a, 24a'; 14b, 14b', 16b, 16b', 18b, 18b', 20b, 20b', 22b, 22b', 24b, 24b'; 14c, 16c, 18c, 20c, 22c, 24c, 142c, 144c, 146c, 148c, 150c, 152c), and comprising at least one power supply unit (26a; 26b; 26c), characterized in that the at least twelve coils (14a, 14a', 16a, 16a', 18a, 18a', 20a, 20a', 22a, 22a', 24a, 24a'; 14b, 14b', 16b, 16b', 18b, 18b', 20b, 20b', 22b, 22b', 24b, 24b'; 14c, 16c, 18c, 20c, 22c, 24c, 142c, 144c, 146c, 148c, 150c, 152c) of the at least one stator (12a; 12b; 12c), which directly follow one another in the circumferential direction (36a; 36b; 36c), are connected in at least one operating state to different phases of the power supply unit (26a; 26b; 26c), and wherein opposing coils (14a, 14a', 16a, 16a', 18a, 18a', 20a, 20a', 22a, 22a', 24a, 24a'; 14b, 14b', 16b, 16b', 18b, 18b', 20b, 20b', 22b, 22b', 24b, 24b') of the at least one stator (12a; 12b) are connected in parallel in each case.

2. The motor apparatus as claimed in claim 1, characterized in that the at least one power supply unit (26a; 26b) comprises at least one first inverter (28a; 30b) which energizes a first coil (14a; 14b) and a second coil (14a'; 14b') of the stator (12a; 12b), and comprises at least one second inverter (32a; 34b) which energizes one further coil (16a, 16a'; 16b, 16b') of the stator (12a; 12b), which is disposed between the first coil (14a; 14b) and the second coil (14a'; 14b') in the circumferential direction (36a; 36b).

3. The motor apparatus as claimed in claim 2, characterized in that the at least one power supply unit (26a; 26b) comprises at least one first inverter assembly (38a; 40b) which includes the first inverter (28a; 30b), and comprises at least one second inverter assembly (42a; 44b) which includes the second inverter (32a; 34b).

4. The motor apparatus as claimed in claim 3, characterized in that the second inverter assembly (42a; 44b) of the at least one power supply unit (26a; 26b) is designed out-of-phase with respect to the first inverter assembly (38a; 40b) of the at least one power supply unit (26a; 26b).

5. The motor apparatus as claimed at least in claim 3, characterized in that at least one of the at least two inverter assemblies (38a, 42a) is designed as a three-fold half bridge.

6. The motor apparatus as claimed at least in claim 3, characterized in that at least one of the at least two inverter assemblies (40b, 44b, 46b, 48b, 50b, 52b) is designed as a four-quadrant regulator.

7. The motor apparatus as claimed in claim 1, characterized in that opposing coils (14a, 14a', 16a, 16a', 18a, 18a', 20a, 20a', 22a, 22a', 24a, 24a'; 14b, 14b', 16b, 16b', 18b, 18b', 20b, 20b', 22b, 22b', 24b, 24b') of the at least one stator (12a; 12b) form one coil group in each case.

8. The motor apparatus as claimed in claim 1, characterized in that the coils (14c, 16c, 18c, 20c, 22c, 24c, 142c, 144c, 146c, 148c, 150c, 152c) of the at least one stator (12c) are energized by an inverter (154c, 156c, 158c, 160c, 162c, 164c, 166c, 168c, 170c, 172c, 174c, 176c), respectively, of the power supply unit (26c).

9. The motor apparatus as claimed in claim 1, characterized by at least one rotor (54a; 54b; 54c) which comprises at least ten poles (56a; 56b; 56c).

10. An EPS drive comprising a motor apparatus (10a; 10b; 10c) as claimed in claim 1.

11. The motor apparatus as claimed in claim 1, wherein the motor apparatus is an electronically commutated motor apparatus.

* * * * *